(12) United States Patent
Vezyrtzis et al.

(10) Patent No.: US 12,057,842 B2
(45) Date of Patent: Aug. 6, 2024

(54) DYNAMIC PULSE GENERATOR WITH SMALL PROPAGATION DELAY

(71) Applicant: Bitmain Development Inc., Dover, DE (US)

(72) Inventors: Christos Vezyrtzis, San Jose, CA (US); Peter Holm, Seattle, WA (US); Steve Beccue, Frazier Park, CA (US)

(73) Assignee: BITMAIN DEVELOPMENT INC., Dover, DE (US)

( * ) Notice: Subject to any disclaimer, the term of this patent is extended or adjusted under 35 U.S.C. 154(b) by 0 days.

(21) Appl. No.: 17/246,145

(22) Filed: Apr. 30, 2021

(65) Prior Publication Data

US 2022/0352879 A1 Nov. 3, 2022

(51) Int. Cl.
*H03K 5/01* (2006.01)
*H03K 5/00* (2006.01)
*H03K 17/687* (2006.01)

(52) U.S. Cl.
CPC ........... *H03K 5/01* (2013.01); *H03K 17/6872* (2013.01); *H03K 2005/00078* (2013.01)

(58) Field of Classification Search
CPC ................. H03K 5/01; H03K 17/6872; H03K 2005/00078
See application file for complete search history.

(56) References Cited

U.S. PATENT DOCUMENTS

| | | | | |
|---|---|---|---|---|
| 6,356,132 B1 * | 3/2002 | Mastrocola | ............ | H03K 5/131 327/299 |
| 6,809,602 B2 * | 10/2004 | Boerstler | ............. | H03K 3/0315 327/158 |
| 7,429,884 B2 * | 9/2008 | Ebergen | .................... | G06F 1/04 327/112 |
| 8,941,430 B2 * | 1/2015 | Palmer | ................... | H03K 5/131 327/263 |
| 2005/0237098 A1 * | 10/2005 | Park | ....................... | H03K 3/355 327/291 |

* cited by examiner

*Primary Examiner* — Ryan Johnson
*Assistant Examiner* — Colleen J O Toole
(74) *Attorney, Agent, or Firm* — Jon E. Gordon; Haug Partners LLP

(57) ABSTRACT

Embodiments of the invention provide for a dynamic pulse generator which can combine both the sequential element and the pulse logic into one stage, thereby eliminating the wasted time resulting from a pulse generator' input-to-output propagation delay. The dynamic pulse generator can include a plurality of P-MOS an N-MOS transistors, a first delay element, and a second delay element.

11 Claims, 3 Drawing Sheets

Dynamic Pulse Generator 100

PRIOR ART

DYNAMIC PULSE GENERATOR WITH SMALL PROPAGATION DELAY

BACKGROUND

A shift register can be implemented as a chain of latches, where Q1=D2, Q2=D3, etc., and where data moves one latch at a time per clock cycle. In this regard, the latches in the shift register cannot share the same clock pulse. Instead, shift registers use a reverse clock propagation. This guarantees that clock pulses of different stage do not overlap, e.g., in order to avoid hold violations (i.e., data running through multiple stages at once). Reverse clock propagation can be achieved with causal pulse generators, in which a particular clock pulse does not start until a preceding pulse is finished.

As depicted in FIG. 1, a pulse generator can include a static D flip flop, an AND gate, a multiplexer, and a large buffer. In this regard, the static D flip flop can include an inverter at its clock input so that the static D flip flop starts producing an output pulse at the falling edge of a positive clock pulse input CPin. Then, the AND gate combines the output of the static D flip flop with its delayed version to make a narrow pulse. In this regard, the pulse delay is programmable through the multiplexer, which can select the amount of delay. Then, a large buffer is used to drive the next stage (pulse generator) and latches. Further, when the delayed version of the D flip flop arrives at the multiplexer output, and the output pulse CPout is completed, the D flip flop is reset so that it can handle the next input pulse.

However, the design and internal components of the pulse generator results in a lot of wasted time. For example, the static D flip flop is typically very slow. Further, because the AND gate and buffer are separate cells, they also result in wasted time. As such, the next pulse cannot begin immediately after the previous one.

Accordingly, it would be desirable to have systems and methods that reduce the time wasted as a result of the pulse generator input-to-output propagation delay.

BRIEF SUMMARY OF THE INVENTION

Embodiments of the invention relate to a dynamic pulse generator which can combine both the sequential element and the pulse logic into one stage, thereby eliminating the wasted time a result of the of pulse generator input-to-output propagation delay.

According to an embodiment, the pulse generator can include: a first P-channel metal-oxide-semiconductor (P-MOS) transistor; a second P-MOS transistor; a first N-type metal-oxide-semiconductor (N-MOS) transistor; a first delay element; and a second delay element that is not the first delay element, the second delay element being a programmable delay element. In this regard, the first delay element can be configured to generate a delayed version of a clock pulse input. Further, the second delay element can be configured to generate a delayed version of a clock pulse output. Further, the first P-MOS transistor can include: a first gate connected to an output of the first delay element, a first drain connected to a first intermediate node, and a first source connected to a first power supply. Further, the first N-MOS transistor can include: a third gate connected to an output of the second delay element, a third drain connected the clock pulse output; and a third source connected to a second power supply.

According to an embodiment, the first delay element can include a plurality of digital complementary metal-oxide-semiconductor (CMOS) inverters connected in a chain configuration. Further, the first delay element can include an odd number of digital CMOS inverters.

According to an embodiment, the second delay element can include a plurality of digital CMOS inverters and a plurality of digital CMOS tri-state inverters. In this regard, each tri-state inverter can include a third P-MOS transistor, a fourth P-MOS transistor, a second N-MOS transistor, and a third N-MOS transistor. Further, the third P-MOS transistor can include a fourth gate connected to a first digital input, a fourth drain connected to a second intermediate node, and a fourth source connected to the first power supply. Further, the fourth P-MOS transistor can include: a fifth gate connected to an input signal, a fifth drain connected to an output, and a fifth source connected to the second intermediate node. Further, the second N-MOS transistor can include: a sixth gate connected to an second digital input, a sixth drain connected to a third intermediate node, and a sixth source connected to the second power supply. In this regard, the second digital input can be a complement of the first digital input. Further, the third N-MOS transistor can include: a seventh gate connected to the input signal, a seventh drain connected to the output, and a seventh source connected to the third intermediate node.

BRIEF DESCRIPTION OF THE DRAWINGS

Some aspects of the disclosure are herein described, by way of example only, with reference to the accompanying drawings. With specific reference now to the drawings in detail, it is stressed that the particulars shown are by way of example and are for purposes of illustrative discussion of embodiments of the disclosure. In this regard, the description, taken with the drawings, makes apparent to those skilled in the art how aspects of the disclosure may be practiced.

DETAILED DESCRIPTION OF PREFERRED EMBODIMENTS

This description is not intended to be a detailed catalog of all the different ways in which the disclosure may be implemented, or all the features that may be added to the instant disclosure. For example, features illustrated with respect to one embodiment may be incorporated into other embodiments, and features illustrated with respect to a particular embodiment may be deleted from that embodiment. Thus, the disclosure contemplates that in some embodiments of the disclosure, any feature or combination of features set forth herein can be excluded or omitted. In addition, numerous variations and additions to the various embodiments suggested herein will be apparent to those skilled in the art in light of the instant disclosure, which do not depart from the instant disclosure. In other instances, well-known structures, interfaces, and processes have not been shown in detail in order not to unnecessarily obscure the invention. It is intended that no part of this specification be construed to affect a disavowal of any part of the full scope of the invention. Hence, the following descriptions are intended to illustrate some particular embodiments of the disclosure, and not to exhaustively specify all permutations, combinations and variations thereof.

Unless explicitly stated otherwise, the definition of any term herein is solely for identification and the reader's convenience; no such definition shall be taken to mean that any term is being given any meaning other than that commonly understood by one of ordinary skill in the art to which this disclosure belongs, unless the definition herein cannot reasonably be reconciled with that meaning. Further, in the absence of such explicit definition, all technical and scientific terms used herein have the same meaning as commonly understood by one of ordinary skill in the art to which this disclosure belongs. The terminology used in the description of the disclosure herein is for the purpose of describing particular embodiments only and is not intended to be limiting of the disclosure.

Figure 1:
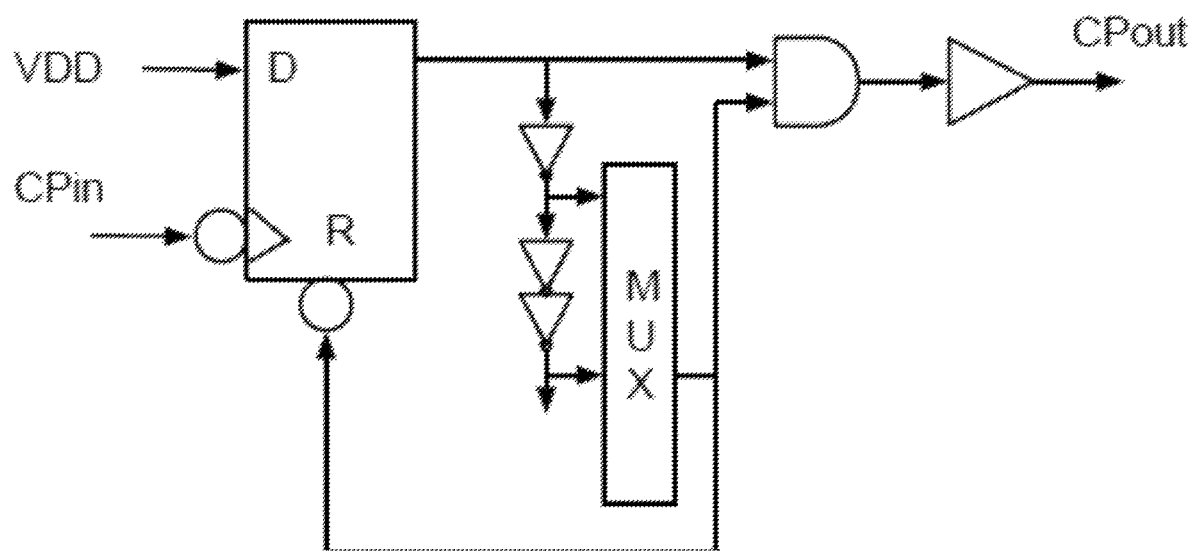
FIG. 1 depicts a pulse generator circuit.
Figure 2:
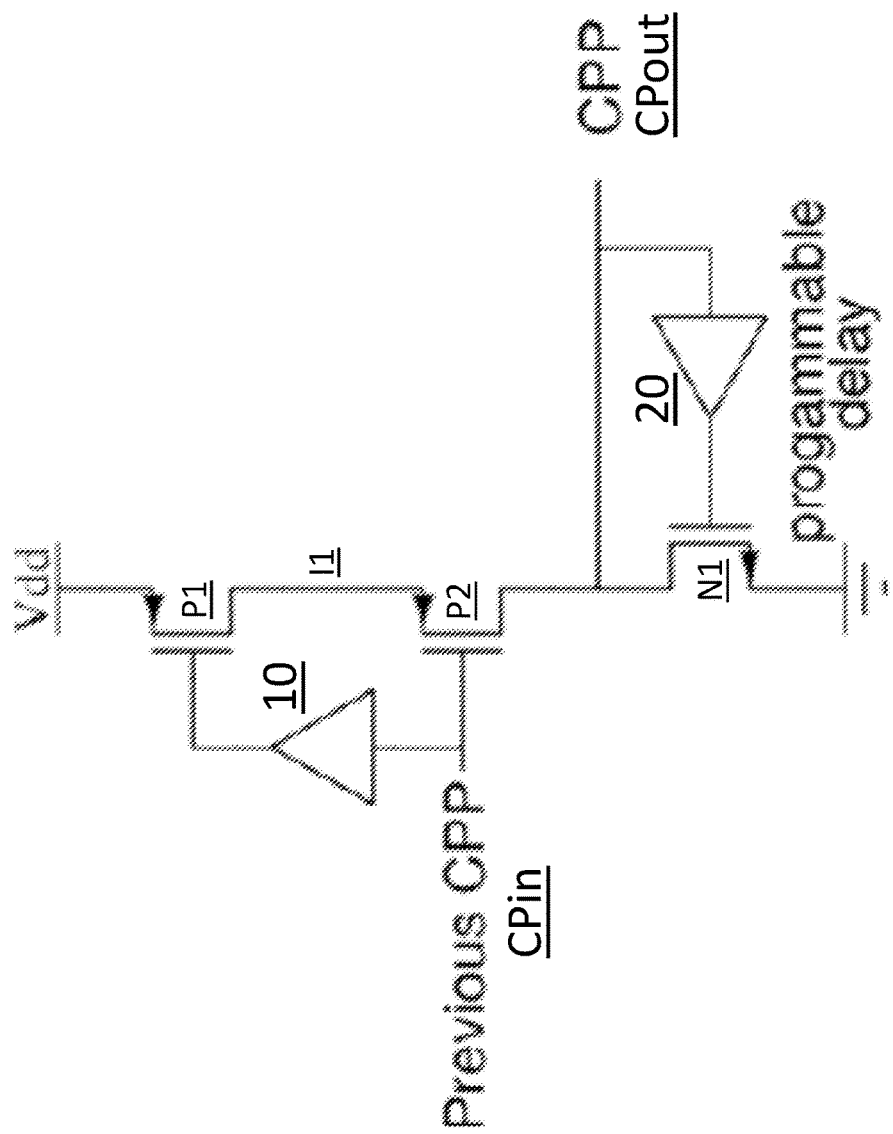
FIG. 2 depicts a dynamic pulse generator according to an embodiment of the invention.

FIG. 2 depicts an exemplary dynamic pulse generator according to an embodiment of the invention. As depicted in the figure, a dynamic pulse generator 100 can include a first P-channel metal-oxide-semiconductor (P-MOS) transistor P1, a second P-MOS transistor P2, an N-type metal-oxide-semiconductor (N-MOS) transistor N1, a delay element 10, and a programmable delay element 20.

Further, the dynamic pulse generator 100 can receive a clock pulse input ($CP_{in}$) and produce a clock pulse output ($CP_{out}$). Further, the dynamic pulse generator 100 can also receive a plurality of digital inputs D[i] and DB[i] for setting the pulse width of the programmable delay element 20, which will be described in more detail below.

According to an embodiment, the gate of the transistor P1 can be connected to an output of the delay element 10, the drain of the transistor P1 can be connected to an intermediate node I1, and the source of the transistor P1 can be connected to a power supply $V_{DD}$. According to an embodiment, the intermediate node I1 can be located between transistors P1 and P2.

According to an embodiment, the gate of the transistor P2 can be connected to $CP_{in}$, the drain of the transistor P2 can be connected to $CP_{out}$, and the source of the transistor P2 can be connected to the intermediate node I1.

According to an embodiment, the gate of the transistor N1 can be connected to an output of the programmable delay element 20, the drain of the transistor N1 can be connected to $CP_{out}$, and the source of the transistor N1 can be connected to the power supply $V_{SS}$ (i.e., ground).

Figure 3:
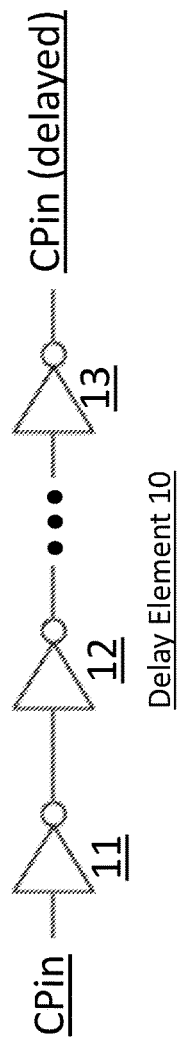
FIG. 3 depicts an exemplary delay element according to an embodiment of the invention.

FIG. 3 depicts the delay element 10 according to an embodiment of the invention. As depicted in the figure, the delay element 10 can be comprised of a plurality of digital complementary metal-oxide-semiconductor (CMOS) inverters connected in a chain configuration, and odd in number, in order to generate a desired delayed version of $CP_{in}$. In this regard, a first CMOS inverter 11 can receive $CP_{in}$ as an input and generate a delayed version of $CP_{in}$ as an output, a second CMOS inverter 12 can receive the first inverter's output as an input and can generate a delayed version of the first inverter's output as an output, . . . , and a final CMOS inverter 13 can generate the desired delayed version of $CP_{in}$.

Figure 4:
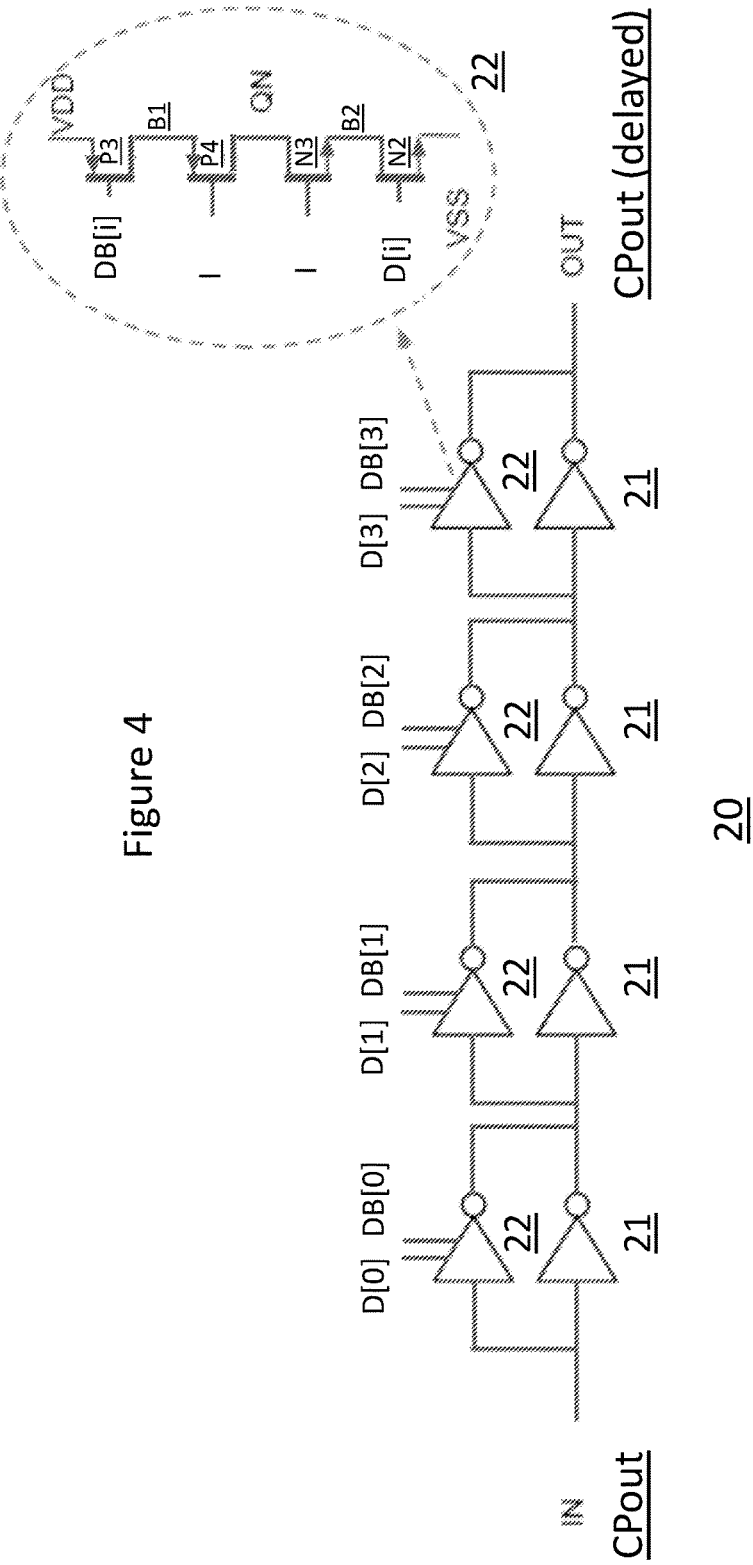
FIG. 4 depicts an exemplary programmable delay element according to an embodiment of the invention.

FIG. 4 depicts the programmable delay element 20 according to an embodiment of the invention. As depicted in the figure, the programmable delay element 20 can include an input IN (i.e., input signal to be delayed), e.g., $CP_{out}$, and an output OUT (i.e., delayed output signal), e.g., delayed version of $CP_{out}$, and can receive a plurality of digital control bits D[i] and DB[i], with DB[i] being a complement of D[i]. Further, the programmable delay element 20 can include a plurality of inverter stages, even in number, where each stage can include a digital CMOS inverter 21 (which can include a plurality of P-MOS transistors in parallel and a plurality of N-MOS transistors in parallel) and a digital CMOS tri-state inverter 22.

According to an embodiment, a particular tri-state inverter 22 can be enabled or disabled using the digital control bits D[i] and DB[i]. For example, the particular tri-state inverter 22 can be enabled if D[i]=1 and DB[i]=0, otherwise it's disabled.

According to an embodiment, the delay of the programmable delay element 20 can be set based on the sum of the delays of the individual stages. In this regard, the delay of the particular stage is a function of the tri-state inverter 22 setting. For example, if the tri-state inverter 22 is enabled, then there are two paths from input to output (inverter 21+tri-state inverter 22), so the stage is faster. If the tri-state inverter 22 is disabled, then the delay of the stage can only be set by the inverter 21 and, therefore, the stage is slower. Accordingly, if D[i]=1 (and DB[i]=0), the tri-state inverter 22 is enabled and, therefore, the delay for that particular stage is small. On the other hand, if D[i]=0 (and DB[i]=1), the tri-state inverter 22 is disabled and, therefore, the delay for that particular stage is larger. For example, assuming there are four inverter stages, there would be four D[i] bits and four DB[i] bits, which can also be thermometer coded. Accordingly, to set the largest delay, the D[i] bits can be set to 0000, while the DB[i] bits can be set to 1111. Further, the next, slightly smaller, delay can be set by setting D[i] bits to 0001 and the DB[i] bits to 1110. Further, the next, slightly smaller, delay can be set by setting D[i] bits to 0011 and the DB[i] bits to 1100, etc. According to another embodiment, the total delay provided by the programmable delay element 20 can be based on an alternative configuration of the control bits D[i] and DB[i].

According to an embodiment, each tri-state inverter can include a P-MOS transistor P3, a P-MOS transistor P4, an N-MOS transistor N2, and an N-MOS transistor N3. According to another embodiment, each tri-state inverter 22 can include additional P-MOS and N-MOS transistors (e.g., in parallel).

According to an embodiment, the gate of the transistor P3 can be connected to DB[i], the drain of the transistor P3 can be connected to the intermediate node B1, and the source of the transistor P3 can be connected to the power supply $V_{DD}$.

According to an embodiment, the gate of the transistor P4 can be connected to the input signal I, the drain of the transistor P4 can be connected to an output QN, and the source of the transistor P4 can be connected to an intermediate node B1.

According to an embodiment, the gate of the transistor N2 can be connected to D[i], the drain of the transistor N2 can be connected to an intermediate node B2, and the source of the transistor N2 can be connected to the power supply $V_{SS}$.

According to an embodiment, the gate of the transistor N3 can be connected to the input signal I, the drain of the transistor N3 can be connected to the output QN, and the source of the transistor N2 can be connected to the intermediate node B2.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

The foregoing detailed description of the present disclosure is to be understood as being in every respect illustrative and exemplary, but not restrictive, and the scope of the present disclosure provided herein is not to be determined solely from the detailed description, but rather from the claims as interpreted according to the full breadth and scope permitted by patent laws. It is to be understood that the embodiments shown and described herein are merely illustrative of the principles addressed by the present disclosure and that various modifications may be implemented by those skilled in the art without departing from the scope and spirit of the present disclosure. Those skilled in the art may implement various other feature combinations without departing from the scope and spirit of the present disclosure. The various functional modules shown are for illustrative purposes only, and may be combined, rearranged and/or otherwise modified.

The invention claimed is:

1. A pulse generator, the pulse generator comprising:
   a first P-channel metal-oxide-semiconductor (P-MOS) transistor;
   a second P-MOS transistor;
   a first N-type metal-oxide-semiconductor (N-MOS) transistor;
   a first delay element; and
   a second delay element that is not the first delay element, the second delay element being a programmable delay element; wherein:
   the first delay element is configured to generate a delayed version of a clock pulse input;
   the second delay element is configured to generate a delayed version of a clock pulse output;
   the second delay element includes an input;
   the input of the second delay element is directly connected to the clock pulse output;
   the first P-MOS transistor includes: a first gate connected to an output of the first delay element, a first drain connected to a first intermediate node, and a first source connected to a first power supply;
   the second P-MOS transistor includes: a second gate connected to the clock pulse input, a second drain connected to the clock pulse output, and a second source connected to the first intermediate node;
   the first N-MOS transistor includes: a third gate connected to an output of the second delay element, a third drain connected the clock pulse output; and a third source connected to a second power supply; and
   the second gate is directly connected to the clock pulse input, the second drain is directly connected to the clock pulse output, and the third drain is directly connected the clock pulse output.

2. The pulse generator of claim 1, wherein the first delay element includes a plurality of digital complementary metal-oxide-semiconductor (CMOS) inverters connected in a chain configuration.

3. The pulse generator of claim 2, wherein the first delay element includes an odd number of digital CMOS inverters.

4. The pulse generator of claim 1, wherein the second delay element includes a plurality of digital complementary metal-oxide-semiconductor (CMOS) inverters and a plurality of digital CMOS tri-state inverters.

5. The pulse generator of claim 4, wherein the plurality of digital CMOS inverters are parallel to the plurality of digital CMOS tri-state inverters.

6. The pulse generator of claim 4, wherein each tri-state inverter includes a third P-MOS transistor, a fourth P-MOS transistor, a second N-MOS transistor, and a third N-MOS transistor.

7. The pulse generator of claim 6, wherein the third P-MOS transistor includes: a fourth gate connected to a first digital input, a fourth drain connected to a second intermediate node, and a fourth source connected to the first power supply.

8. The pulse generator of claim 7, wherein the fourth P-MOS transistor includes: a fifth gate connected to an input signal, a fifth drain connected to an output, and a fifth source connected to the second intermediate node.

9. The pulse generator of claim 8, wherein the second N-MOS transistor includes: a sixth gate connected to an second digital input, a sixth drain connected to a third intermediate node, and a sixth source connected to the second power supply.

10. The pulse generator of claim 9, wherein the second digital input is a complement of the first digital input.

11. The pulse generator of claim 10, wherein the third N-MOS transistor includes: a seventh gate connected to the input signal, a seventh drain connected to the output, and a seventh source connected to the third intermediate node.

* * * * *